(12) United States Patent
Rondena et al.

(10) Patent No.: US 8,906,257 B2
(45) Date of Patent: Dec. 9, 2014

(54) COMPOSITE GETTER FOR MANUFACTURING PHOTOVOLTAIC PANELS

(71) Applicant: SAES Getters S.p.A., Lainate (IT)

(72) Inventors: Sergio Rondena, Magenta (IT); Antonio Bonucci, Milan (IT); Giorgio Longoni, Monza (IT); Luca Toia, Carnago (IT); Marco Amiotti, Cornaredo (IT)

(73) Assignee: SAES Getters S.p.A., Lainate (MI) (IT)

( * ) Notice: Subject to any disclaimer, the term of this patent is extended or adjusted under 35 U.S.C. 154(b) by 0 days.

(21) Appl. No.: 14/446,278

(22) Filed: Jul. 29, 2014

(65) Prior Publication Data

US 2014/0332065 A1   Nov. 13, 2014

Related U.S. Application Data

(63) Continuation of application No. 12/679,280, filed as application No. PCT/EP2008/062782 on Sep. 24, 2008.

(30) Foreign Application Priority Data

Oct. 4, 2007 (IT) .............................. MI2007A1902

(51) Int. Cl.
 *C09K 3/00* (2006.01)
 *C08K 3/22* (2006.01)
 *H01J 31/00* (2006.01)
 *H01L 31/18* (2006.01)
 *H01J 7/18* (2006.01)

(52) U.S. Cl.
 USPC ........ 252/194; 252/181.7; 524/433; 524/436; 257/E31.11

(58) Field of Classification Search
 USPC ........................ 252/194, 181.7; 524/433, 436
 See application file for complete search history.

(56) References Cited

U.S. PATENT DOCUMENTS

| | | | |
|---|---|---|---|
| 3,998,680 A | 12/1976 | Flint | |
| 4,453,997 A * | 6/1984 | Hori et al. | 156/305 |
| 5,548,012 A * | 8/1996 | Yamamoto et al. | 524/433 |
| 6,534,571 B1 * | 3/2003 | Hoover | 524/59 |
| 2003/0079772 A1 | 5/2003 | Gittings et al. | |
| 2003/0222413 A1 * | 12/2003 | Hatanaka | 277/650 |
| 2005/0284516 A1 | 12/2005 | Koll | |

FOREIGN PATENT DOCUMENTS

| | | |
|---|---|---|
| EP | 1617494 | 1/2006 |
| EP | 1788034 | 5/2007 |
| EP | 1788037 | 5/2007 |
| EP | 2206161 | 9/2013 |

(Continued)

OTHER PUBLICATIONS

Wronski, C.R., et al., Progess in Amorphous Silicon Based Solar Cell Technology, World Climate & Energy Event, Jan. 6-11, 2002, 67-72.

(Continued)

*Primary Examiner* — Joseph D Anthony
(74) *Attorney, Agent, or Firm* — Steinfl & Bruno LLP

(57) ABSTRACT

The present invention refers to a composite getter for thin-film photovoltaic panels which is made with a polymer having low $H_2O$ transmission containing one or more alkaline earth metal oxide, to a photovoltaic panel containing such composite getter and to a method for the manufacturing of photovoltaic panels.

9 Claims, 5 Drawing Sheets

(56) References Cited

FOREIGN PATENT DOCUMENTS

| JP | 09-116180 | 5/1997 |
|---|---|---|
| JP | 2800528 | 9/1998 |
| JP | 2007-250082 | 9/2007 |
| WO | 03050891 | 6/2003 |
| WO | 2004019421 | 3/2004 |

OTHER PUBLICATIONS

Von Roedern, B., Status of Amorphous and Crystalline Thin-Film Silicon Solar Cell Activities, NCPV and Solar Program Review Meeting 2003, 552-555.
Romeo, A., et al., Development of Thin-film Cu(In,Ga)Se$_2$ and CdTe Solar Cells, Progess in Photovoltaics: Research and Applications 2004, 12: 93-111.
Carlsson, T., Stability Diagnostics for Thin-film Photovoltaic Modules, Ph.D Thesis, Helsinki University, published in 2006, 1-72.
Wenerberg, J., Design and Stability of Cu(In,Ga)Se$_2$-Based Solar Cell Modules, Ph.D Thesis, Uppsala University, published in 2002.
Jorgensen, G.J., et al., Testing of Packaging Materials for Improved PV Module Reliability, NREL/CP-520-37366 2005, 1-7.
Marais, S, et al., Permeation and Sorption of Water and Gases Through EVA Copolymers Films, Material Resources Innovation 2002, 6: 79-88.
Notification of Reexamination mailed on Mar. 19, 2014 for Chinese Application 200880109847.6 filed on Sep. 24, 2008 in the name of SAES Getters S.P.A. (English translation and Chinese original).
Notification of Reexamination mailed on May 13, 2014 for Chinese Application 200880109847.6 filed on Sep. 24, 2008 in the name of SAES Getters S.P.A. (English translation and Chinese original).
Non-Final Office Action mailed on Dec. 31, 2013 for U.S. Appl. No. 13/016,435, filed Jan. 28, 2011 in the name of Antonio Bonucci et al.
Final Office Action mailed on Apr. 14, 2014 for U.S. Appl. No. 13/016,435, filed Jan. 28, 2011 in the name of Antonio Bonucci et al.
Decision of Final Rejection mailed on Jan. 7, 2014 for Japanese Application No. 2010-527406 filed on Dec. 24, 2010 in the name of SAES Getters S.P.A.
EP Communications 124(4) mailed on Dec. 13, 2012 for European Application No. 08804686.7 filed on Mar. 25, 2010 in the name of SAES Getters S.P.A.
EP Communications 94(3) mailed on Dec. 11, 2010 for European Application No. 08804686.7 filed on Mar. 25, 2010 in the name of SAES Getters S.P.A.
EP Communications 115(1) mailed on Jul. 9, 2012 for European Application No. 08804686.7 filed on Mar. 25, 2010 in the name of SAES Getters S.P.A.

\* cited by examiner

COMPOSITE GETTER FOR MANUFACTURING PHOTOVOLTAIC PANELS

CROSS REFERENCE TO RELATED APPLICATIONS

The present application is a continuation of U.S. application Ser. No. 12/679,280 filed on Jul. 12, 2010 which herein is incorporated by reference in its entirety and which, in turn, is the US national stage of International Application PCT/EP2008/062782 filed on Sep. 24, 2008 which, in turn, claims priority to Italian Application MI2007A001902, filed on Oct. 4, 2007.

The present invention refers to a composite getter for preventing the $H_2O$ ingress into photovoltaic (either silicon based or thin-film) panels made by means of a dispersion of an active element consisting essentially of one or more alkaline earth metal oxides in a polymeric matrix having low $H_2O$ transmission.

The terms photovoltaic and solar indicate the same or equivalent type of devices (panel, cells) and are to be considered technically equivalent, even though in the following it will be preferably employed the term photovoltaic panel.

A photovoltaic panel is composed of one or more photovoltaic elements (so-called cells) for the conversion of solar energy into electric energy. By the term photovoltaic cell reference is made to a single active element, that is the element that converts the luminescent radiation into electric energy, while by photovoltaic panel reference is made to the final product, that is to the set of suitably interconnected solar cells, provided with electrical connections and finally encapsulated. A photovoltaic panel may contain more than one photovoltaic cells (the number of solar cells can vary from 50 to 150). Typically in a thin-film panel the number of photovoltaic cells is about 80.

There are various types of photovoltaic cells. Among those recently developed, the thin-film photovoltaic cells are of particular interest, due to their conversion efficiency and industrial feasibility. In these cells the active element is deposited in form of a film on a (vitreous, metallic or plastic) substrate and is not present in the form of expensive stripes or slices as in the case of mono- or polycrystalline silicon solar cells. In these cells are also present metallizations placed in contact with the active element, having the function of interconnecting the cells as such and transporting the current generated by them.

Among the most interesting typologies of this kind of cells there are the cells based on cadmium-tellurium, amorphous silicon, copper-indium-selenium having gallium and sulphur added and the cells based on gallium arsenide. More information on the different typologies of photovoltaic cells and their functioning can be found in the article "Progress in Amorphous Silicon Based Solar Cell Technology", by Wronski et al., presented at "World Climate & Energy Event" in 2002, in the article "Status of Amorphous and Crystalline Thin-Film Silicon Solar Cell Activities", by Bolko von Roedern, presented in 2003 at "NCPV and Solar Review Meeting" and in the article "Development of Thin-Film $Cu(In,Ga)Se_2$ and CdTe Solar Cells" by Romeo et al., published in "Progress in Photovoltaics: Research and Application" in 2004, volume 12, pp 93-111.

The final structure of the photovoltaic panel is rather standardized and independent on the specific type of photovoltaic cell and foresees the use of two, vitreous or plastic, supports to confine and enclose the photovoltaic element. These supports, one of which necessarily must be transparent to the light radiation, ensure also the mechanical stability and the protection from the atmospheric agents.

These supports are typically joined together by arranging an encapsulating polymer having good adhesive properties in the space between the two supports; in some cases there can also be spacing elements that fix the distance between the supports, while in other cases it is the thickness of the encapsulating polymer to determine the distance between the supports. The composite getter being object of the present invention is used in both of the above-mentioned structures.

In the following the supports are identified and distinguished between each other by the use of the terms "upper support" that refers to the support through which the radiation reaches the cell, and "lower support" that identifies the support on the back of the cell.

The photovoltaic element can be directly in contact with one of the inner surfaces of the supports of the photovoltaic module or can be completely encapsulated by a transparent polymeric material having a low transmission for $H_2O$, that is a transmission lower than $10 \, g \, m^{-2} \, d^{-1}$ mm (grams of $H_2O$ per square meter per day for each millimeter of thickness of the material) at 25° C. and 60% of relative humidity (RH). In the technical field the transmission of water by the polymer can also be characterized by means of the MVTR, standing for Moisture Vapour Transmission Rate; the two are strictly correlated, the permeability being the MVTR multiplied by the thickness of the polymeric material and divided by the pressure.

The polymeric material used for encapsulating the photovoltaic element is typically composed of EthylVinylAcetate (EVA); often used are also thermoplastic polyurethanes (TPU) and PolyVinylButyral (PVB). This polymeric material has essentially the aim to fill the inner volume of the photovoltaic panel giving to it at the same time also mechanical stability. By inner volume of the photovoltaic panel is intended the volume that is defined by the two supports and by the frame of the panel (typically formed of a polymer having good adhesive properties) that is not occupied by the photovoltaic element or by the other constructive elements of the photovoltaic panel (for example the electric contacts). If the photovoltaic element is in contact with one of the two supports (typically the lower one), it finds itself encapsulated on three sides by the encapsulating polymeric material.

The manufacturing process of a photovoltaic panel foresees also a process of thermosealing. In this regard two main types of processes are used: one foresees the use of a vacuum laminator, while the other foresees the use of an autoclave. In both cases the thermosealing is usually carried out between 100 and 170° C. This process results in the melting of the encapsulating polymer.

Independently from the specific type of photovoltaic cell, the presence of $H_2O$ inside the photovoltaic panel deteriorates its characteristics; the deterioration mechanisms triggered by the presence of $H_2O$ act both at the cell level and at the photovoltaic module level. As far as the cell is concerned, the deterioration is due to the oxidation and the corrosion of the thin films that form the cell, while as far as the module is concerned, there is the corrosion of the metallizations used for the electric connections. Further information in this respect can be found in the Ph.D. thesis "Stability Diagnostics for Thin-Film Photovoltaic Modules" by T. Carlsson of Helsinki University, published in 2006, and in the Ph.D. thesis "Design and Stability of $Cu(In,Ga)Se_2$-Based Solar Cell Modules" by J. Wannerberg of Uppsala University, published in 2006.

The peripheral adhesion region, between the upper support and the lower support, which also can be seen as the frame of the panel, represents a preferential region for the entry of water inside the device since the two supports, upper and lower one, are to be considered impermeable for $H_2O$.

The problem of the presence of $H_2O$ inside the photovoltaic panel has been confronted according to three main approaches: introduction of a $H_2O$ sorbing material inside the panel; use of a barrier having low $H_2O$ transmission; use of a barrier having low $H_2O$ transmission and containing also a $H_2O$ sorbing element.

As far as the first type of solution is concerned, that is the inclusion of a sorbing material inside the photovoltaic cell or panel, this is described in the Japanese patent JP 2800528 B2, in which the use of various possible water sorbers is described, such sorbers being positioned in the photovoltaic cell in peripheral regions of the lower surface thereof. In this document the absorbing element choice is totally independent from the problem of the photovoltaic panel sealing.

The use of barriers having low $H_2O$ transmission, comprising a $H_2O$ sorbing material, is described in the patent application EP 1617494 A2, where such barrier replaces the upper support of the photovoltaic panel.

The use of adhesives arranged in peripheral regions of the panel to make the upper and lower support stick to each other is described in the patent application WO 2004/019421, that specifies special types of adhesives having low $H_2O$ transmission, while the document WO 03/050891 describes sealing materials containing a limited weight percentage, between 0.1% and 10%, of a $H_2O$ sorber.

The above solutions tend to tackle the problem of the $H_2O$ ingress into the photovoltaic panel simply by dimensioning the active barriers according to their $H_2O$ sorbing capacity, that is considering and evaluating the characteristics of these barriers based on the quantity of $H_2O$ that these are able to sorb.

The inventors have instead analyzed the problem on the basis of a different parameter and approach, that is the "lag time" that the water needs to reach the inside of the device; this parameter actually indicates when the constructive elements of the panel begin to deteriorate, whose progressive degeneration during the life results in the deterioration of the characteristics of the panel.

Particularly for thin-film photovoltaic panels it is very important to adopt technical solutions that are capable of ensuring a lag time for the $H_2O$ ingress of at least 10 years or more generally to prolong as much as possible the panel lifetime.

In particular the inventors have identified a class of materials, the alkaline earth metals oxides, that when used for the manufacturing of composite getters allow to obtain lag times definitely superior (at the same $H_2O$ capacity) with respect to composite getters made according to the prior art, thus allowing to prolong the life of the photovoltaic panels.

Object of the present invention is thus to provide a composite getter material for the manufacturing of photovoltaic panels capable of increasing the lag time.

In a first aspect thereof the invention consists in a composite getter for photovoltaic panels comprising a $H_2O$ sorber dispersed in a polymeric matrix having low $H_2O$ transmission, characterized in that said moisture sorber consists essentially of one or more alkaline earth metal oxide.

The invention will be illustrated in the following with reference to the drawings, in which.

Figure 1A:
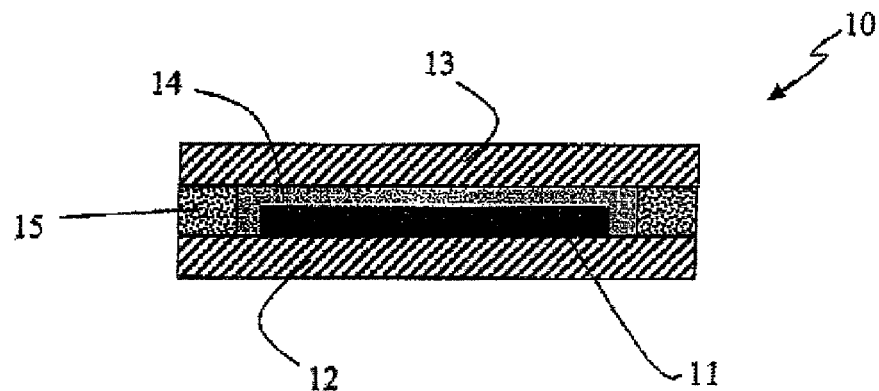
FIGS. 1A and 1B show a thin-film photovoltaic panel containing a composite getter according to the present invention, respectively before and after the process of thermosealing.
Figure 1B:
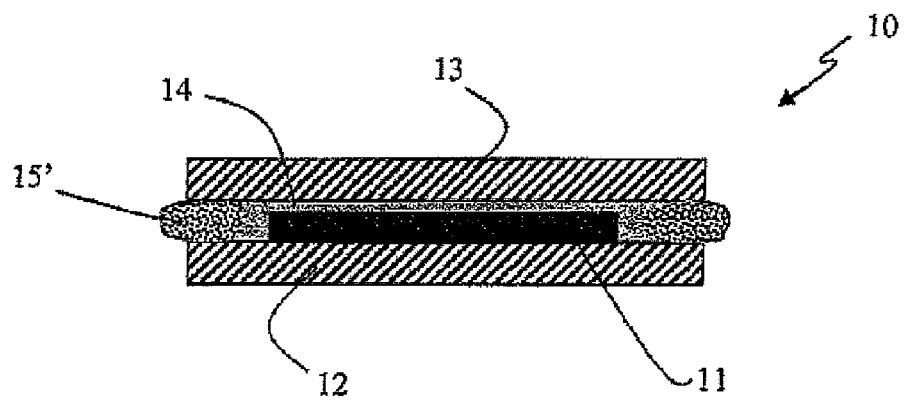

In the drawings in FIGS. 1A and 1B the dimensions and the dimensional relations between the various elements, particularly with reference to their thicknesses, are not correct, but have been distorted for the sake of better comprehensibility of the figures. Further some constitutive elements of a photovoltaic panel, as for example electrical feedthroughs and connections, have not been shown because they are not relevant for the description of the present invention.

Concerning the properties required for the polymers used for manufacturing the composite getter according to the present invention, these must have a low $H_2O$ transmission, preferably lower than 10 g m$^{-2}$ d$^{-1}$ mm if measured at 25° C. and 60% RH.

In a preferred embodiment the polymeric matrix is a welding polymeric matrix, meaning that its adhesive properties show or improve following a thermal treatment such as the thermosealing, i.e. the heating to a temperature between 100 and 170° C. This condition often implies that the polymeric matrix must have a melting temperature lower than 170° C.

Polymers useful for carrying out the invention are for example EthylVinylAcetate (EVA), polyethylene of low (LDPE), medium (MDPE) and high (HDPE) density, polyether block amides (PEBA), ionomeric resins such as Surlyn™ commercialized by DuPont, ethylene-acrylic acid copolymers as for example Lucalen® commercialized by Basell, polyvinylidene fluoride (PVDF), PolyVinylButyral (PVB), polyvinylidene chloride (PVDC) such as Saran™ commercialized by DOW Chemicals, Ethylene-Propylene Rubbers (EPR), Ethylene Propylene Diene Monomer Rubbers (EPDM) and butyl rubbers.

In order to realize the composite getter according to the present invention, preferred is the use of EVA and even more preferred the use of EPR rubbers.

Further these polymers must also have good adhesive characteristics for the supports of the photovoltaic panel. These supports can be made from glass or, in the case it is desired to obtain flexible panels, can be made from plastic materials such as ethylene tetrafluoroethylene (ETFE).

The adhesive properties of these polymers can be improved by adding suitable additives such as for example adhesive promoters based on silane or polyolefines functionalized by maleic anhydride grafting, in such a way to obtain panels that have a lap shear force resistance of 0.3-15 N mm$^{-2}$. Further information on this characteristic may be found in the article by Jorgenson et al. "Testing of Packaging Materials for Improved PV Module Reliability" published in NREL/CP-520-37366.

It is pointed out that the $H_2O$ transmission by a polymeric matrix is not linked univocally only to the type of polymer but is a function of various parameters, among which the composition is one of the most relevant ones; thus it is important not to choose the polymer on the basis of the class it belongs to but on the basis of its $H_2O$ transmission and melting temperature, information easily available to an expert in the field. For example as far as the transmission characteristics of EVA are concerned, this information is available in the article by Marais et al. "Permeation and Sorption of Water and Gases through EVA Copolymers Films" published in 2002 in Mat. Res. Innovation, Vol. 6, pp. 79-88.

The inventors have found that properties such as the $H_2O$ transmission of the polymeric matrix as well as the capacity of the material, defined as quantity of $H_2O$ sorbed per weight unit, are not the only ones that influence the lag time.

The inventors have found that the nature and type of absorber plays a key role. For this purpose the use of some specific sorbing materials, the alkaline earth metal oxides, offers advantages with respect to the use of other types of $H_2O$ sorbers, such as for example zeolites, alumina and silica.

Even though the composite getter is realized with alkaline metal oxides, the presence of other compounds at low levels may not be excluded, depending on the purity of the starting materials; in this regard it is important that the composite getter consists essentially of one or more alkaline metal oxide, meaning that at least 90% of the moisture sorber is an alkaline earth metal oxide.

In order to simplify the production process it is preferred to manufacture composite getters comprising essentially only one type of alkaline earth metal oxide; in this regard preferred is the use of magnesium oxide, and even more preferred is the use of calcium oxide.

The composite getter system being object of the present invention contains a quantity of $H_2O$ sorber, between 10 wt % and 50 wt %: preferably this percentage is between 30% and 45%. It is important that the concentration in weight of this sorbing material must be not less than 10% to ensure a sufficient lag time. On the other side this concentration has an upper limit because excessively loaded composite getters show problems with respect to the adhesiveness for the substrates.

FIG. 1A shows in cross section a thin film panel 10, containing a composite getter 15 of the present invention, before the operation of thermosealing of the supports. In this drawing the photovoltaic element 11 has been shown in contact with the lower support 12. This element is encapsulated by a polymeric material 14 that fills the inner volume of the photovoltaic panel delimited by the lower support 12, by the upper support 13 and by the composite getter made according to the present invention.

FIG. 1B shows the photovoltaic panel 10 after the process of thermosealing: in this case it is possible that the thickness of the composite getter 15' becomes smaller with respect to the starting thickness of the composite getter 15 as a consequence of the combined action of the weight of the upper support and the heating. Further it is possible that the composite getter 15' slightly stands out, both towards the inside and towards the outside of the panel 10, in this case the quantity of material that outflows from the panel is removed, such removal process is typically called trimming in the technical field.

In a second aspect thereof the invention relates to a thin-film photovoltaic panel containing a composite getter, in which said composite getter comprises a $H_2O$ sorber dispersed in a polymeric matrix having low $H_2O$ transmission, characterized in that said sorber consists essentially of one or more alkaline earth metal oxide.

Generally the photovoltaic panels of the present invention provide for the positioning of the composite getter, typically in the faun of a strip, close to the edge or the frame of the panel; in other words the composite getter forms the side interface of the panel to the outer atmosphere. The upper and lower interfaces of the photovoltaic panel are instead formed by the upper and lower support.

In a third aspect thereof the invention refers to a method for the manufacturing of photovoltaic panels, characterized in that the composite getter being object of the present invention is arranged close to the edge of one of the two supports, subsequently the other support is laid over and the panel undergoes the thermal process of thermosealing.

Two main types of processes are used for thermosealing: one foresees the use of a vacuum laminator, while the other foresees the use of an autoclave. In both cases the thermosealing is usually carried out between 100 and 170° C. This process typically consists in a heating to a temperature between 100° C. and 170° C., for a time period variable between 3 and 40 minutes.

The invention will be further described by means of the following non-limiting examples.

Different samples of composite getters are produced via extrusion of a blend of a polymerix matrix and a moisture sorber. The extrusion process avoids exposure of the activated moisture sorbers to ambient air.

The prepared samples are listed in table 1 that reports the polymeric matrix, its permeability characteristics, the moisture sorber type and its loading content in terms of weight % into the polymeric matrix.

TABLE 1

| ID | Polymeric Matrix | MVTR @ 0.6 mm (g mm in$^{-2}$ day$^{-1}$) @ 25° C. 100% RH | Sorbing Material | Load (wt %) |
| --- | --- | --- | --- | --- |
| Sample 1 | EVA 33% Vinyl Acetate | 4.8 | CaO | 20% |
| Sample 2 | EVA 33% Vinyl Acetate | 4.8 | CaO | 40% |
| Sample 3 | EVA 33% Vinyl Acetate | 4.8 | MgO | 40% |
| Sample 4 | EPR 70% Ethylene Propylene 30% Polypropylene | 2.7 | CaO | 40% |
| Sample 5 (comparative) | EVA 33% Vinyl Acetate | 4.8 | Zeolites 13X | 40% |

The lag time is not directly measurable on a photovoltaic panel since a complete test will require years to complete, whereby accelerated testing procedure have been internally developed, using as starting point the ASTM procedure ASTM E-96-00.

In particular the lag times for the various samples have been evaluated using anodized aluminum cups having a diameter of 25 mm, filled with 1 gram of water distilled and closed with a cap, whose inner part, 15 mm, consists of a 0.75 mm thick layer of the sample under evaluation.

The sample is placed in a drier kept at 25° C., and the weight of the aluminum cup is measured over time. The time at which the cup starts to lose weight represents the lag time, since it is the time required for moisture to leave the cup, passing through the composite getter placed on the cup. The cup in this case simulates the ambient environment, whereas the drier atmosphere simulates the panel environment. The purpose of these tests is to provide a relative comparison for the lag times of the different samples.

The lag times obtained for the various samples are reported in table 2.

TABLE 2

| ID | Lag Time (hours) |
| --- | --- |
| Sample 1 | 80 |
| Sample 2 | 160 |
| Sample 3 | 80 |
| Sample 4 | 340 |
| Sample 5 | 20 |

It is important to remark that the previous results refer to the lag times obtained in the accelerated tests conditions, in order to better appreciate the impact of these results the above lag times have used to estimate the required widths as side barriers for the photovoltaic panel, for the composite getter in order to ensure a 10 years photovoltaic panel lifetime, such results are reported in table 3.

TABLE 3

| ID | Estimated required width (mm) for 10 years @ 25° C., 60% RH | Estimated required width (mm) for 10 years @ 25° C., 40% RH |
| --- | --- | --- |
| Sample 1 | 15.4 | 12.6 |
| Sample 2 | 10.9 | 8.9 |
| Sample 3 | 15.4 | 12.6 |
| Sample 4 | 7.5 | 6.1 |
| Sample 5 (comparative) | 30.8 | 25.1 |

The required width with sample 5 is not compatible with the available lateral space within a photovolatic panel, that typically is less than 20 mm. A more efficient composite getter as the one object of the present invention allows for a prolonged panel lifetime if the same width is kept, otherwise minimizes the lost space thanks to the reduced width in order to guarantee the required lifetime.

The two best samples, sample 2 and sample 4, were also characterized with another experiment by means of 15×15 cm dummy panels mounting on the frame different widths of composite getters; in this case it is possible to directly observe the moisture penetration front thanks to a darker coloration in correspondence to the wetted areas of the frame. Also the tests on the dummy panel have been necessarily carried out in accelerated conditions, meaning that the panel have been tested at 85° C. and 85% RH.

Figure 2:
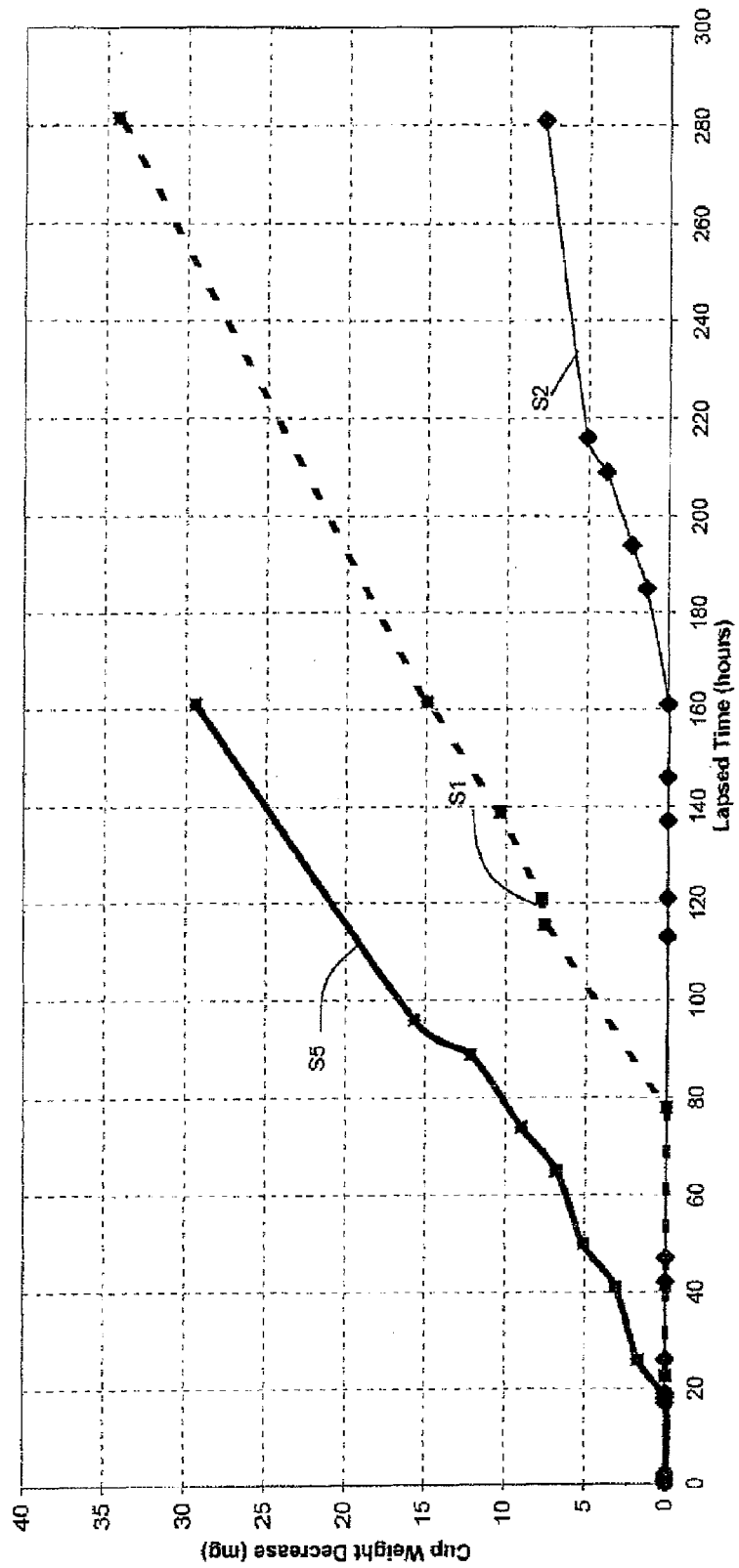
FIG. 2 shows a comparison between composite getters according to the present invention and a composite getter according to the known art.
Figure 3:
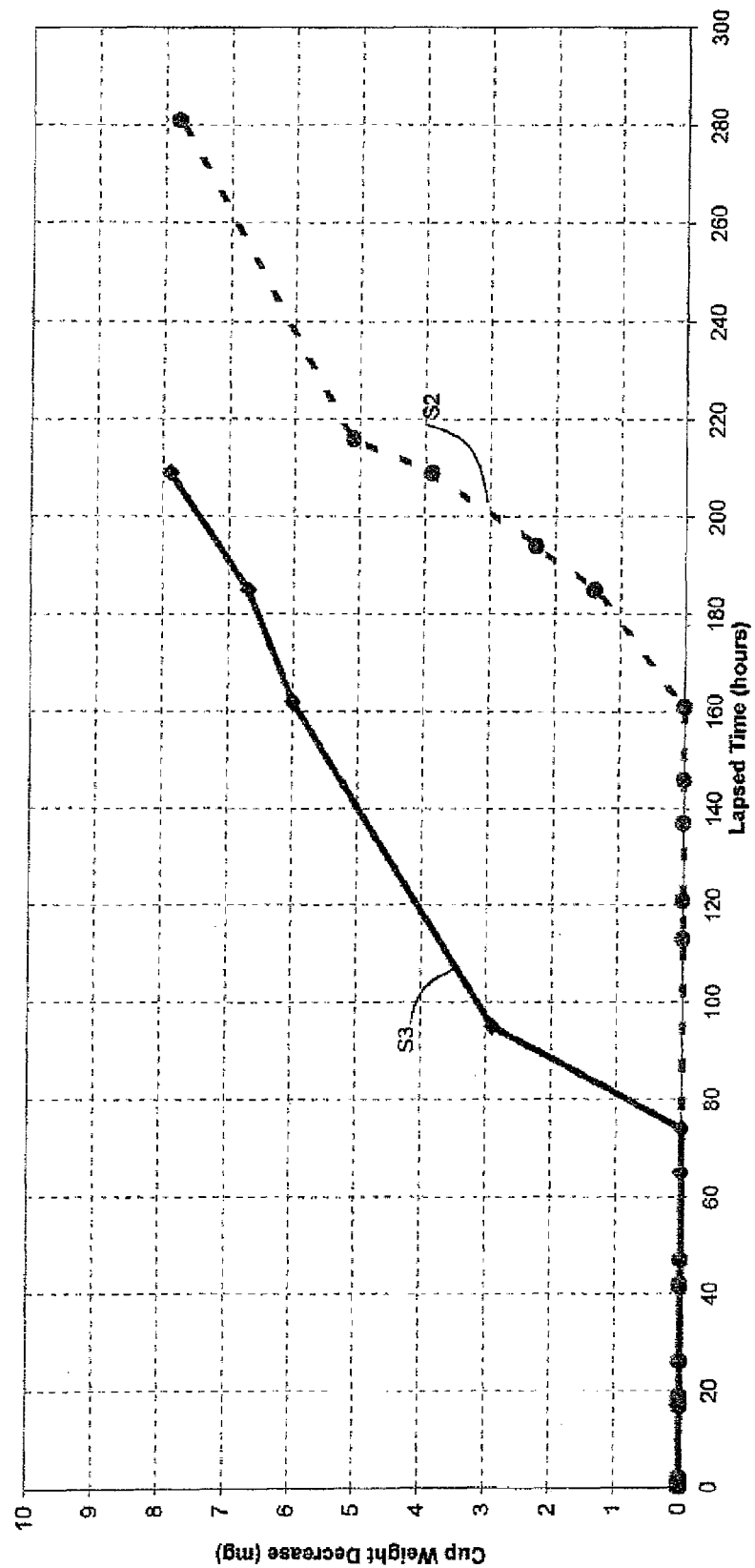
FIG. 3 shows a comparison between two composite getter according to the present invention, containing different moisture sorbers.
Figure 4:
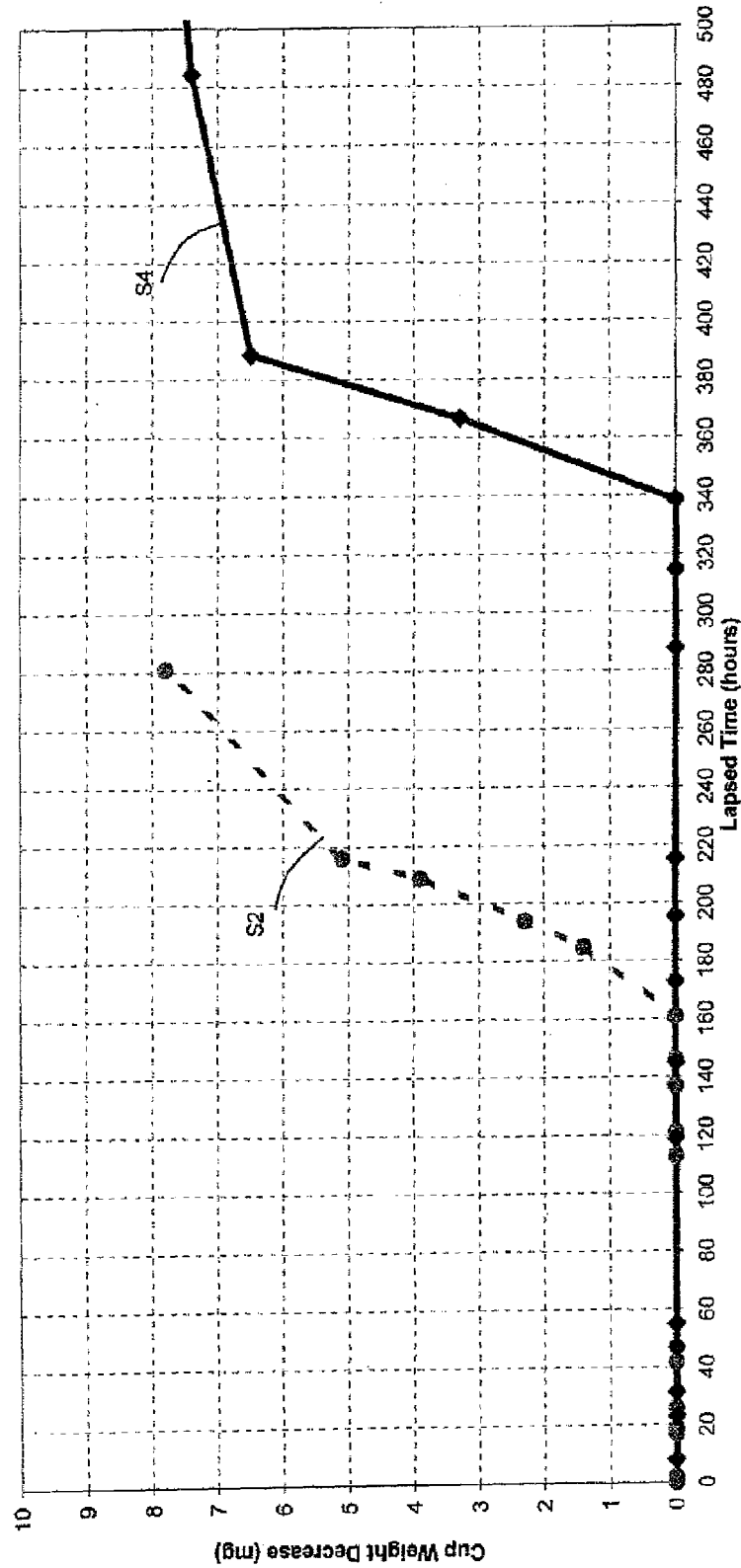
FIG. 4 shows a comparison between composite getter according to the present invention realized with different polymeric matrixes.

The comparison curves for the various experiments carried out are shown in FIGS. 2-4: in particular FIG. 2 shows the comparison between the weight loss curve S1 obtained for sample 1, shown as a dotted line, with the weight loss curve S2 obtained for sample 2 and the weight loss curve S5, obtained with the comparative sample 5, shown as a thick line. Such comparison shows that the lag time for sample 1, obtained with a composite getter according to the present invention, is about twice with respect to a composite getter obtained with zeolites. Such a comparison is rather important since sample 1 has been loaded with a 20 wt % quantity of moisture sorber, while comparative sample 5 with 40 wt %. The different loadings have been used to prove that the lag time is not a mere function of the moisture sorption capacity, since with these different loading levels samples 1 and 5 have an equivalent capacity, but a lag time that differs by a factor 2 when a composite getter according to the present invention is used. From FIG. 2 it is also possible to observe that the lag time, at a first and rough approximation, depends linearly from the loaded quantity of moisture sorber, being the lag time of sample 2 about twice the one for sample 1, and being sample 2 loaded with twice the amount of calcium oxide.

FIG. 3 shows the comparison between the weight loss curve S2 obtained for sample 2, shown as a dotted line, with the weight loss curve S3, shown as thick line, obtained with sample 3. Also these data show that the moisture capacity is not the main parameter influencing the lag time, since sample 3 being loaded with MgO presents a higher moisture absorption capacity with respect to sample 2 that has been loaded with the same wt % of CaO, but has a lower lag time, almost a factor 2 with respect to sample 2.

FIG. 4 shows the comparison between the weight loss curve S4 obtained for sample 4, shown as a thick line, with the weight loss curve S3, shown as dotted line, obtained with sample 3. These data show the improved properties of composite getter obtained with EPR rubbers polymeric matrix, with respect to EVA based composite getters.

Figure 5:
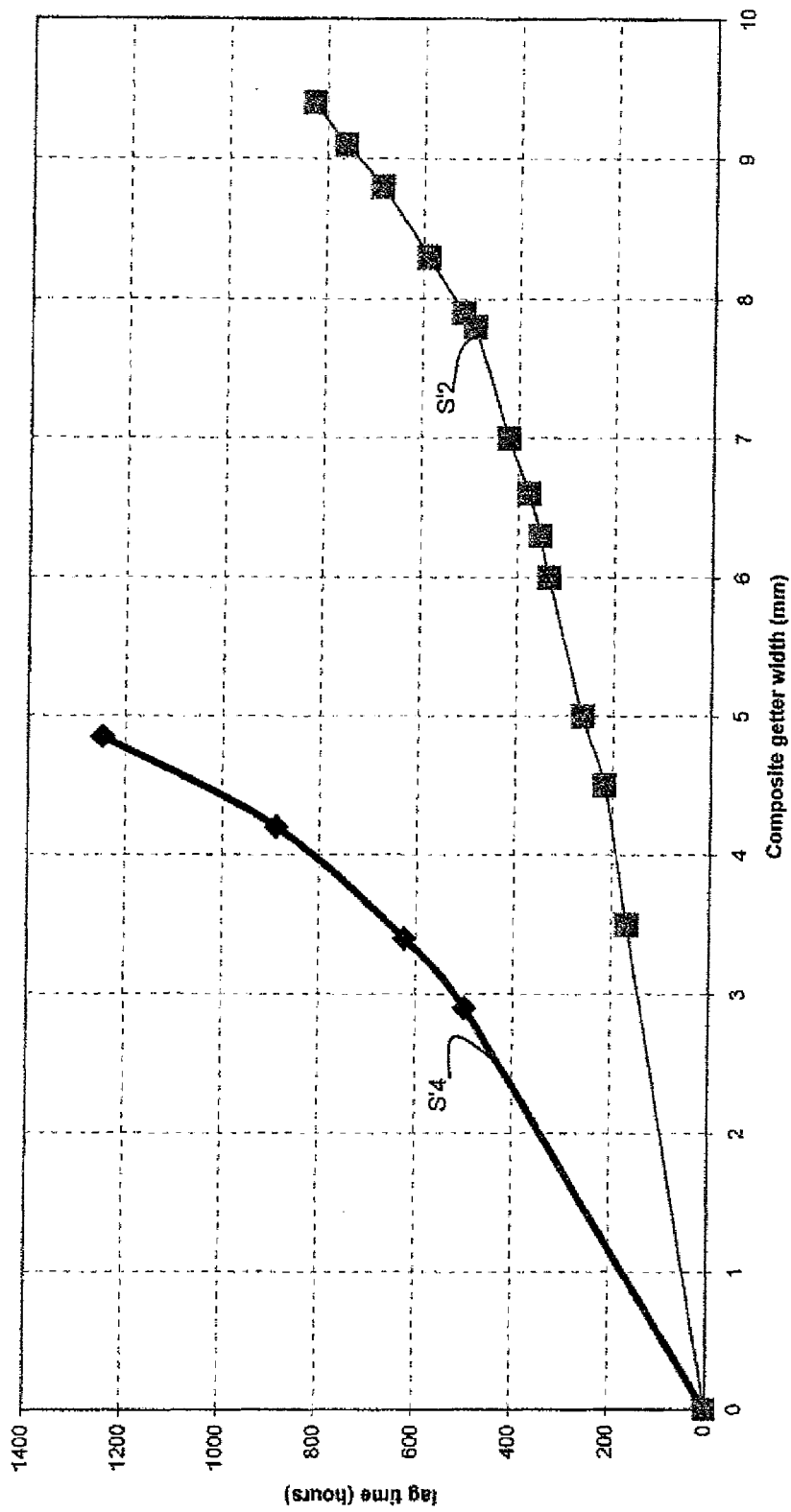
FIG. 5 shows tests results obtained on dummy panels with two preferred composite getters according to the present invention.

FIG. 5 is a direct comparison of the lag time obtained with different width on the dummy panels, where the thicker curve S'4 refers to the results obtained with sample 4, while curve S'2 shows the results obtained with sample 2.

The invention claimed is:

1. A photovoltaic panel comprising:
    at least one photovoltaic element;
    a lower support and an upper support; and
    a composite getter comprising a $H_2O$ sorber dispersed in a polymeric matrix, characterized in that said $H_2O$ sorber consists essentially of between 20 and 50% by weight of one or more alkaline earth metal oxide and said polymeric matrix has a $H_2O$ transmission lower than 10 g mm m$^2$ d$^{-1}$ at 25° C. and 60% relative humidity and the material forming said polymer is chosen among Ethyl Vinyl Acetate (EVA) and Ethylene-Propylene Rubbers (EPR) and
    wherein said photovoltaic panel is delimited by said lower support, said upper support and by said composite getter, and said photovoltaic panel comprises a polymeric material, different from said composite getter, filling an inner volume of the photovoltaic panel and encapsulating said at least one photovoltaic element.

2. A photovoltaic panel according to claim 1, in which said polymeric matrix has a melting temperature lower than 170° C.

3. A photovoltaic panel according to claim 1, in which said polymeric matrix has a shear force resistance from 0.3 N/mm$^2$ to 15 N/mm$^2$.

4. A photovoltaic panel according to claim 1 wherein said alkaline earth metal oxide is chosen from CaO, MgO and their combinations.

5. A photovoltaic panel according to claim 4 wherein said alkaline getter metal oxide is CaO.

6. A method for the manufacturing of a photovoltaic panel according to claim 1, comprising the steps of:
    positioning said composite getter close to the edge of said lower support or said upper support;
    laying over the other one of said lower support or said upper support; and
    thermosealing said photovoltaic panel in such a way that a photovoltaic panel comprising:
    at least one photovoltaic element,
    a lower support and an upper support; and
    a composite getter comprising a $H_2O$ sorber dispersed in a polymeric matrix, characterized in that said $H_2O$ sorber consists essentially of between 20 and 50% by weight of one or more alkaline earth metal oxide and said polymeric matrix has a $H_2O$ transmission lower than 10 g mm m$^2$d$^{-1}$ at 25° C. and 60% relative humidity and the material forming said polymer is chosen among Ethyl Vinyl Acetate (EVA) and Ethylene-Propylene Rubbers (EPR) and wherein said photovoltaic panel is delimited by said lower support, said upper support and by said composite getter, and said photovoltaic panel comprises a polymeric material, different from said composite getter, filling an inner volume of the photovoltaic panel and encapsulating said at least one photovoltaic element, results.

7. A method according to claim 6, in which said treatment of thermosealing is carried out at a temperature between 100° C. and 170° C.

8. A method according to claim 6 wherein said thermosealing is carried out in an autoclave.

9. A method according to claim 6 wherein said thermosealing is carried out in a vacuum laminator.

* * * * *